(12) United States Patent
Itou et al.

(10) Patent No.: US 7,705,115 B2
(45) Date of Patent: Apr. 27, 2010

(54) PROCESS FOR PRODUCING RADIATION-SENSITIVE RESIN COMPOSITION

(75) Inventors: Kouji Itou, Tokyo (JP); Kouichirou Yoshida, Tokyo (JP)

(73) Assignee: JSR Corporation, Tokyo (JP)

( * ) Notice: Subject to any disclaimer, the term of this patent is extended or adjusted under 35 U.S.C. 154(b) by 232 days.

(21) Appl. No.: 11/913,361

(22) PCT Filed: May 12, 2006

(86) PCT No.: PCT/JP2006/309587

§ 371 (c)(1),
(2), (4) Date: Nov. 1, 2007

(87) PCT Pub. No.: WO2006/121162

PCT Pub. Date: Nov. 16, 2006

(65) Prior Publication Data

US 2009/0081586 A1 Mar. 26, 2009

(30) Foreign Application Priority Data

May 13, 2005 (JP) .............................. 2005-141208

(51) Int. Cl.
*C08F 6/00* (2006.01)
*C08J 3/00* (2006.01)

(52) U.S. Cl. ............................... 528/502 A; 430/270.1; 430/285.1; 430/286.1; 528/480; 556/1

(58) Field of Classification Search .............. 430/270.1, 430/285.1, 286.1; 528/480, 502 A; 556/1
See application file for complete search history.

(56) References Cited

U.S. PATENT DOCUMENTS

| 7,342,087 B2* | 3/2008 | Yamagishi et al. .......... 528/480 |
| 2002/0187421 A1 | 12/2002 | Hioki et al. |
| 2005/0227172 A1 | 10/2005 | Ozaki et al. |
| 2006/0058433 A1 | 3/2006 | Yamagishi et al. |
| 2006/0135745 A1 | 6/2006 | Hada et al. |
| 2007/0269741 A1* | 11/2007 | Iijima et al. .............. 430/270.1 |

FOREIGN PATENT DOCUMENTS

| JP | 2001-125269 | 5/2001 |
| JP | 2001-350266 | 12/2001 |
| JP | 2002-62667 | 2/2002 |
| JP | 2002-311600 | 10/2002 |
| JP | 2003-311601 | 10/2002 |
| JP | 2003-330202 | 11/2003 |
| JP | 2004-53887 | 2/2004 |
| JP | 2004-195427 | 7/2004 |
| JP | 2005-189789 | 7/2005 |
| JP | 2005-300737 | 10/2005 |
| JP | 2006-083214 | 3/2006 |

* cited by examiner

*Primary Examiner*—Terressa M Boykin
(74) *Attorney, Agent, or Firm*—Ditthavong Mori & Steiner, P.C.

(57) ABSTRACT

A process for producing a radiation-sensitive resin composition includes the steps of providing a filter apparatus equipped with a filter composed of a polyamide resin filter and a polyethylene resin filter connected in series, circulating a precursor composition for the radiation-sensitive resin composition in the filter apparatus so that the precursor composition is passed through the filter two or more times to thereby effect filtration with the result that foreign matter is removed from the precursor composition.

2 Claims, No Drawings

PROCESS FOR PRODUCING RADIATION-SENSITIVE RESIN COMPOSITION

TECHNICAL FIELD

The present invention relates to a radiation-sensitive resin composition suitable as a resist useful for microfabrication utilizing various types of radiation such as deep ultraviolet rays such as a KrF excimer laser, an ArF excimer laser, or an $F_2$ excimer laser, X-rays such as synchrotron radiation, or charged particle rays such as electron beams.

BACKGROUND ART

In the field of microfabrication represented by fabrication of integrated circuit devices, the design rules have become more and more minute in order to achieve higher integration. Development of a lithographic process enabling microfabrication in a stable manner has been actively pursued.

In order to satisfy such a demand, various radiation-sensitive resin compositions for chemically amplified resists have been developed. In such a lithographic process, foreign matter in the radiation-sensitive resin composition which could have been disregarded in the past is now found to cause development defects and reduce the yield of semiconductor devices as an increased demand for miniaturization has been raised.

In order to overcome this problem, filtering methods to remove foreign matter in radiation-sensitive resin compositions have been proposed (for example, Patent Documents 1 to 4).

[Patent Document 1] JP-A-2002-311600
[Patent Document 2] JP-A-2002-311601
[Patent Document 3] JP-A-2004-53887
[Patent Document 4] JP-A-2004-195427

DISCLOSURE OF THE INVENTION

An object of the present invention is to provide a process for producing a radiation-sensitive resin composition which can efficiently remove foreign matter, can inhibit development defects when used as a resist, and can increase the yield of semiconductor devices.

In order to achieve the above object, the inventors of the present invention have conducted extensive studies on the method for removing foreign matter from a radiation-sensitive resin composition and found that development defects can drastically be decreased by circulation filtration of the radiation-sensitive resin compound using a filter apparatus in which a filter composed of a polyamide resin filter having polarity and a polyethylene resin filter densely packed with fibers are connected in series. This finding has led to the completion of the present invention. That is, the present invention provides the following processes for producing a radiation-curable resin composition.

[1] A process for producing a radiation-sensitive resin composition, comprising providing a filter apparatus equipped with a filter composed of a polyamide resin filter and a polyethylene resin filter connected in series, circulating a precursor composition for the radiation-sensitive resin composition in the filter apparatus so that the precursor composition is passed through the filter two or more times to thereby effect filtration with the result that foreign matter is removed from the precursor composition.

[2] The process for producing a radiation-sensitive resin composition according to [1], wherein the precursor composition comprises:
(A) a photoacid generator;
(B) an alkali-insoluble or a scarcely alkali-soluble resin containing an acid-dissociable group;
(C) a solvent; and
(D) an acid diffusion controller.

[3] The process for producing a radiation-sensitive resin composition according to [1] or [2], wherein the alkali-insoluble or scarcely alkali-soluble resin containing the acid-dissociable group (B) has (b-1) a recurring unit of the following formula (1) and (b-2) at least one recurring unit selected from the group consisting of the recurring unit having the following formula (2), the recurring unit having the following formula (3), and the recurring unit having the following formula (4),

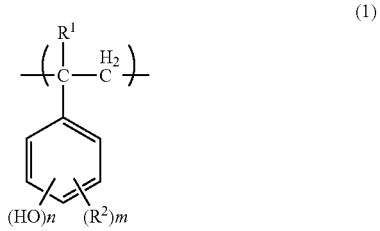

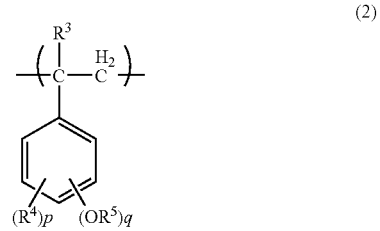

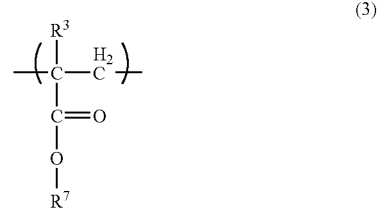

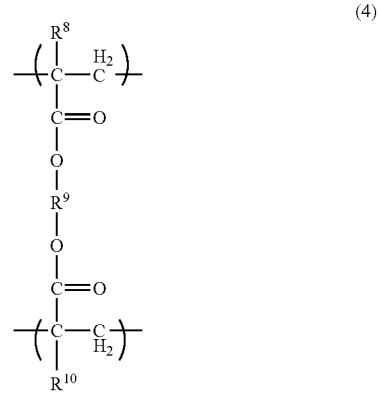

wherein, in the formula (1), $R^1$ represents a hydrogen atom or a methyl group, $R^2$ represents a monovalent organic group, excluding a group equivalent to $-OR^5$ in the formula (2), m is an integer from 0 to 3, n is an integer from 1 to 3, and two or more $R^2$ groups which may be present are either the same or different; in the formula (2), $R^3$ represents a hydrogen atom or a methyl group, $R^4$ represents a monovalent organic group, excluding a group equivalent to —$OR^5$, $R^5$ represents a monovalent acid-dissociable group, p is an integer from 0 to 3, q is an integer from 1 to 3, and two or more $R^4$ or $R^5$ groups, which may respectively be present, are either the same or different; in the formula (3), $R^6$ represents a hydrogen atom or a methyl group, and $R^7$ represents a t-butyl group, a 1-methylcyclopentyl group, or a 1-ethylcyclopentyl group; and in the formula (4), $R^8$ and $R^{10}$, which may be the same or different, represent hydrogen atoms or methyl groups, and $R^9$ represents a divalent acid-dissociable group.

A radiation-sensitive resin composition which can form a resist which produces development defects only to a minimal extent and thus is useful for microfabrication can be produced by the process of the present invention.

BEST MODE FOR CARRYING OUT THE INVENTION

Embodiments of the present invention are described below in detail. Note that the present invention should not be construed as being limited to the following embodiments, and various modifications, improvements, and the like may be made within the scope of the present invention based on the common knowledge of a person skilled in the art.

The process for producing a radiation-sensitive resin composition of the present invention comprises providing a filter apparatus equipped with a filter composed of a polyamide resin filter and a polyethylene resin filter connected in series, and circulating a precursor composition for the radiation-sensitive resin composition in the filter apparatus so that the precursor composition is passed through the filter two or more times to thereby effect filtration with the result that foreign matter is removed from the precursor composition.

[1] Filter Apparatus

In the process of the present invention, a filter apparatus equipped with a filter composed of a polyamide resin filter and a polyethylene resin filter connected in series is used. The combined use of a polyamide resin filter and a polyethylene resin filter makes it possible to effectively remove both foreign matter with high polarity which causes bridge defects, and minute foreign matter which causes blob defects and pattern profile defects.

[1-1] Polyamide Resin Filter

The polyamide resin filter is a filter in which a polyamide resin is used as a filter material. Since the polyamide resin filter uses a polyamide resin having polarity as a filter material, it can effectively remove foreign matter with high polarity which leads to a bridge defect. A bridge defect herein refers to a defect caused by foreign matter having high polarity and poor solubility in an alkaline developer and being present by forming bridges between the lines in line-and-space patterns after development. If there are many of these defects, an electric short circuit may occur when a current test is performed on a device after an etching process.

The polyamide resin is a homopolymer or a copolymer having an amide bond in the main chain. Polyamide 6 and polyamide 66 can be given as specific examples. The pore diameter of the polyamide resin filter is preferably from 0.02 to 0.04 µm, and more preferably 0.04 µm. If the pore diameter of the filter is too large, foreign matter may not be fully removed, and if too small, there is a tendency that the filtration velocity is too slow. "ABD1UND8E", "ABD1UND7EJ", "ABD1UND8EJ" (manufactured by Nihon Pall Ltd.), and the like can be given as specific examples of the polyamide resin.

[1-2] Polyethylene Resin Filter

The polyethylene resin filter is a filter in which a polyethylene resin is used as a filter material. Since the polyethylene resin filter uses a polyethylene resin densely packed with fibers as a filter material, the filter has an excellent size-exclusion effect and can effectively remove minute foreign matter which causes blob defects and pattern profile defects. A blob defect herein refers to a defect caused by minute foreign matter, which is produced by winding of a resin which has not been deprotected around nuclei of some kind of insoluble foreign material. If there are many of these defects, an electric short circuit may occur when a current test is performed on a device after an etching process.

The polyethylene resin is a homopolymer or a copolymer having ethylene units in the main chain. Polyethylene, high density polyethylene, and the like can be given as specific examples. The pore diameter of the polyethylene resin filter is preferably from 0.03 to 0.05 µm, and more preferably 0.03 µm. If the pore diameter of the filter is too large, foreign matter may not be fully removed, and if too small, there is a tendency that the filtration velocity will be too slow. "ABD1UG0037E", "ABD1UG0038EJ", "ABD1UG0058EJ" (manufactured by Nihon Pall Ltd.), and the like can be given as specific examples of the polyethylene resin.

[1-3] Filter Apparatus

These two filters are connected in series in the filter apparatus so that the precursor composition of the radiation-sensitive resin composition may continuously pass through the two filters. Either of the two filters may be the first filter insofar as the precursor composition is continuously filtered.

Since the precursor composition is filtered while being circulated in the filter apparatus, a filter apparatus equipped with, in addition to the filters, a pump (such as a chemical pump) to supply the precursor composition to the filters is preferably used in the process of the present invention.

[2] Circulation Filtration

In the process of the present invention, the precursor composition of the radiation-sensitive resin composition is filtered two or more times through the filters, while being circulated in the filter apparatus (such a filtration operation is herein referred to from time to time as "circulation filtration"). According to the process of the present invention, not only the combined use of a polyamide resin filter and a polyethylene resin filter makes it possible to effectively remove both foreign matter with high polarity and minute foreign matter, but also the circulation filtration brings about a favorable effect of inhibiting an electric short circuit and the like at the time of a current test of a device after an etching process.

In the process of the present invention, the precursor composition must be passed thorough the filter apparatus, in which the polyamide resin filter and the polyethylene resin filter are connected in series, two or more times, preferably 3 to 200 times, and still more preferably 100 to 200 times. If the precursor composition is passed thorough only once, the foreign matter can be removed only incompletely, leaving the possibility of an electric short circuit during a current test of a device after an etching process. Since filtration of 200 times can fully remove the foreign matter, increasing the number of cycles in excess of 200 times brings about no more desirable removing effects.

There are no particular limitations to other conditions of the circulation filtration. The speed at which the precursor composition is passed through the filters (filtration rate) is preferably from 20 to 110 $lm^2/hr$, and more preferably from 50 to 110 $lm^2/hr$. If the filtration rate is less than 20 $lm^2/hr$, filtration may become impossible due to insufficient pressure when the viscosity of the precursor composition is high. If more than 110 lm²/hr, there is a possibility that the foreign matter adsorbed and trapped may be desorbed and released from the filters.

From the viewpoint of maintaining the quality of the precursor composition, the temperature at which the precursor composition is passed through the filters is preferably from 15 to 30° C., and more preferably from 17 to 25° C. If the temperature is less than 15° C., aggregates may be produced in the precursor composition. On the other hand, if the temperature is more than 30° C., the precursor composition may deteriorate.

[3] Precursor Composition

The precursor composition which is the subject of the circulation filtration is usually a liquid containing (A) a photoacid generator, (B) an alkali-insoluble or a scarcely alkali-soluble resin containing an acid-dissociable group, (C) a solvent, and (D) an acid diffusion controller. Each of them is described below in detail.

[3-A] Photoacid Generator (Component A)

The photoacid generator is a compound which generates an acid by being irradiated with various types of radiation such as deep ultraviolet rays such as a KrF excimer laser, an ArF excimer laser, or an $F_2$ excimer laser, X-rays such as synchrotron radiation, or charged particle rays such as electron beams.

[3-A1] Iodonium Salt Compound

As one specific example of preferable photoacid generators, an iodonium salt compound shown by the following formula (5) can be given.

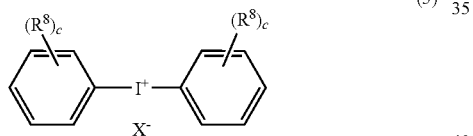

(5)

wherein each $R^8$ independently represents a fluorine atom or a linear or branched alkyl group having 1 to 8 carbon atoms, each c independently represents an integer from 0 to 3, and $X^-$ represents a monovalent anion.

In the formula (5), as examples of the monovalent anion of $X^-$, $MX_i$ (wherein M shows a boron atom, a phosphorus atom, an arsenic atom, or an antimony atom, X shows a halogen atom, and i is a natural number of 4 to 6), a halogen anion, a sulfonic acid anion having 1 to 20 carbon atoms, and a carboxylic acid anion having 1 to 20 carbon atoms, wherein the sulfonic acid anion and carboxylic acid anion may be substituted with a halogen atom or an oxo group, can be given.

As the iodonium salt compounds represented by the formula (5), a compound in which $X^-$ is a sulfonic acid anion is preferable. As specific examples of such a compound, unsubstituted diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium p-trifluoromethylbenzensulfonate, and diphenyliodonium perfluorobenzenesulfonate; and substituted diphenyliodonium compounds such as bis(p-t-butylphenyl)iodonium trifluoromethanesulfonate, bis(p-t-butylphenyl)iodonium nonafluoro-n-butanesulfonate, bis(p-t-butylphenyl)iodonium perfluoro-n-octanesulfonate, bis(p-t-butylphenyl)iodonium p-toluenesulfonate, bis(p-t-butylphenyl)iodonium 10-camphorsulfonate, bis(p-t-butylphenyl)iodonium 4-trifluoromethylbenzensulfonate, bis(p-t-butylphenyl)iodonium perfluorobenzenesulfonate, bis(p-fluorophenyl)iodonium trifluoromethanesulfonate, bis(p-fluorophenyl)iodonium nonafluoro-n-butanesulfonate, bis(p-fluorophenyl)iodonium perfluoro-n-octanesulfonate, bis(p-fluorophenyl)iodonium 10-camphorsulfonate, (p-fluorophenyl)(phenyl)iodonium trifluoromethanesulfonate, (p-fluorophenyl)(phenyl)iodonium nonafluoro-n-butanesulfonate, (p-fluorophenyl)(phenyl)iodonium perfluoro-n-octanesulfonate, and (p-fluorophenyl)(phenyl)iodonium 10-camphorsulfonate can be given.

Of these photoacid generators, diphenyliodonium trifluoromethanesulfonate, diphenyliodonium nonafluoro-n-butanesulfonate, diphenyliodonium 10-camphorsulfonate, bis(p-fluorophenyl)iodonium trifluoromethanesulfonate, bis(p-fluorophenyl)iodonium nonafluoro-n-butanesulfonate, and bis(p-fluorophenyl)iodonium 10-camphorsulfonate are preferable.

[3-A2] Sulfonium Salt Compound

As another specific example of preferable photoacid generators, a sulfonium salt compound shown by the following formula (6) can be given.

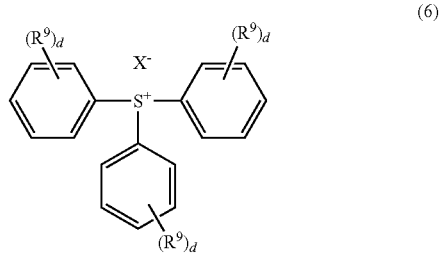

(6)

wherein each $R^9$ independently represents a fluorine atom or an alkyl or an alkoxyl group having 1 to 8 carbon atoms, each d independently represents an integer from 0 to 3, and $X^-$ represents a monovalent anion.

As examples of the monovalent anion represented by $X^-$ in the formula (6), the same groups as those previously given for the monovalent anion in the formula (4) can be given. Among these, a sulfonic acid anion is preferable.

As specific examples of the sulfonium salt compound, 2,4,6-trimethylphenyldiphenylsulfonium 2,4-difluorobenzenesulfonate, triphenylsulfonium trifluoromethanesulfonate, triphenylsulfonium nonafluoro-n-butanesulfonate, triphenylsulfonium perfluoro-n-octanesulfonate, triphenylsulfonium p-toluenesulfonate, triphenylsulfonium benzenesulfonate, triphenylsulfonium 10-camphorsulfonate, triphenylsulfonium p-trifluoromethylbenzensulfonate, triphenylsulfonium perfluorobenzenesulfonate, tris(p-methoxyphenyl)sulfonium trifluoromethanesulfonate, tris(p-methoxyphenyl)sulfonium nonafluoro-n-butanesulfonate, tris(p-methoxyphenyl)sulfonium perfluoro-n-octanesulfonate, tris(p-methoxyphenyl)sulfonium p-toluenesulfonate, tris(p-methoxyphenyl)sulfonium benzenesulfonate, tris(p-methoxyphenyl)sulfonium 10-camphorsulfonate, tris(p-methoxyphenyl)sulfonium p-trifluoromethylbenzensulfonate, tris(p-methoxyphenyl)sulfonium perfluorobenzenesulfonate, tris(p-fluorophenyl)

sulfonium trifluoromethanesulfonate, tris(p-fluorophenyl)sulfonium p-toluenesulfonate, (p-hydroxyphenyl)diphenylsulfonium trifluoromethanesulfonate, (p-hydroxyphenyl)diphenylsulfonium p-toluenesulfonate, (p-fluorophenyl)diphenylsulfonium trifluoromethanesulfonate, and (p-fluorophenyl)diphenylsulfonium p-toluenesulfonate can be given. As a specific example of other preferable photoacid generators, sulfonium salt compounds can be given.

[3-A3] Other Compounds

As further specific examples of other preferable photoacid generators, disulfonyldiazomethanes such as bis(cyclohexylsulfonyl)diazomethane, bis(3,3-dimethyl-1,5-dioxaspiro[5.5]dodecane-8-sulfonyl)diazomethane, and bis(t-butylsulfonyl)diazomethane can be given.

These photoacid generators can be used either individually or in combination of two or more in the composition. Of these, N-sulfonyloxyimide compounds and substituted or unsubstituted diphenyliodonium salt compounds are preferable, with a combination of these being still more preferable. Because the N-sulfonyloxyimide compound has a high radiation transmittance and exhibits only a small degree of pattern profile deterioration and small deviation of pattern-line width when the focus shifts, the compound has an effect of enlarging a focal depth allowance. Thus, a combined use of the N-sulfonyloxyimide compound with an iodonium salt compound having a high acid generating efficiency can achieve a larger focal depth allowance.

When the N-sulfonyloxyimide compound and the substituted or unsubstituted diphenyliodonium salt compound are used in combination, the ratio of mass of the N-sulfonyloxyimide compound to the diphenyl iodonium salt compound is preferably from 99:1 to 5:95, more preferably from 95:5 to 40:60, and particularly preferably from 92:8 to 50:50. A better effect of improvement of the focal depth allowance can be obtained when the ratio of these compounds is within this range.

The amount of the photoacid generator to be used is preferably 0.1 to 20 parts by mass, and more preferably 1.0 to 15 parts by mass with respect to 100 parts by mass of the resin of the component B from the viewpoint of ensuring sensitivity and developability as a resist. If the amount of the onium salt compound is less than 0.1 parts by mass, sensitivity and developability tend to decrease. If the amount exceeds 20 parts by mass, a rectangular resist pattern may not be obtained due to decreased transparency to radiation. From the same reason, a preferable amount of the photoacid generator is the same as that of the onium salt compound.

[3-B] Alkali-insoluble or Scarcely Alkali-soluble Resin Containing Acid-dissociable Group (Component B)

The component B is a resin insoluble or scarcely soluble in alkali and containing an acid-dissociable group (hereinafter referred to from time to time as "an acid-dissociable group-containing resin (B)"). The resin becomes soluble in alkali by dissociation of the acid-dissociable group. If 50% or more of the initial film thickness of a resist film remains after development when a film using only the acid-dissociable group-containing resin (B) instead of a resist film is developed under the same alkaline development conditions employed for forming a resist pattern using the resist film formed from a radiation-sensitive resin composition containing the acid-dissociable group-containing resin (B), such a characteristic of the acid-dissociable group-containing resin (B) is referred to as "insoluble or scarcely soluble in alkali" in the present invention. The term "alkali-soluble" refers to the characteristics that do not substantially leave a coating after development under the same conditions.

As the acid-dissociable group-containing resin (B), a resin, insoluble or scarcely soluble in alkali by itself, obtainable from an alkali-soluble resin containing one or more acid functional groups such as a phenolic hydroxyl group or a carboxyl group by replacing hydrogen atoms in the acid functional groups with one or more groups which are dissociable in the presence of an acid can be given. As a preferable acid-dissociable group-containing resin (B), a resin which has (b-1) a recurring unit of the following formula (1) (hereinafter referred to as "recurring unit (1)") and (b-2) at least one recurring unit selected from the group consisting of the recurring unit having the following formula (2) (hereinafter referred to as "recurring unit (2)"), the recurring unit having the following formula (3) (hereinafter referred to as "recurring unit (3)"), and the recurring unit having the following formula (4) (hereinafter referred to as "recurring unit (4)") can be given. Such an acid-dissociable group-containing resin (B) is hereinafter referred to as "resin (B1)".

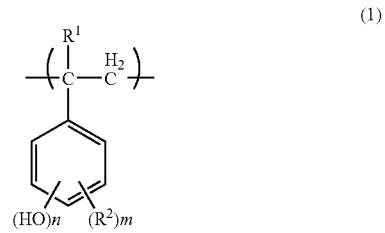

(1)

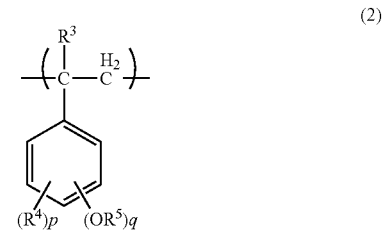

(2)

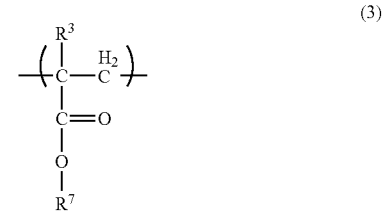

(3)

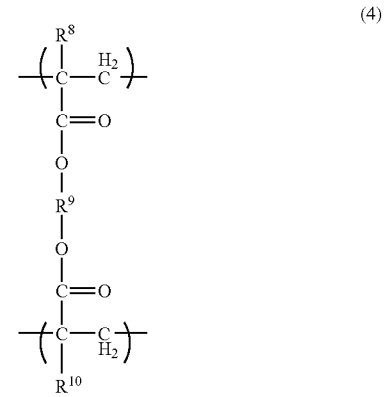

(4)

wherein, in the formula (1), $R^1$ represents a hydrogen atom or a methyl group, $R^2$ represents a monovalent organic group, excluding a group equivalent of $-OR^5$ in the formula (2), m is an integer from 0 to 3, n is an integer from 1 to 3, and two or more $R^2$ groups, which may be present, are either the same or different; in the formula (2), $R^3$ represents a hydrogen atom or a methyl group, $R^4$ represents a monovalent organic group, excluding a group equivalent of $—OR^5$, $R^5$ represents a monovalent acid-dissociable group, p is an integer from 0 to 3, q is an integer from 1 to 3, and two or more $R^4$ or $R^5$ groups, which may respectively be present, are either the same or different; in the formula (3), $R^6$ represents a hydrogen atom or a methyl group, and $R^7$ represents a t-butyl group, a 1-methylcyclopentyl group, or a 1-ethylcyclopentyl group; and in the formula (4), $R^8$ and $R^{10}$, which may be the same or different, represent hydrogen atoms or methyl groups, and $R^9$ represents a divalent acid dissociable group.

As examples of the monovalent organic group represented by $R^2$ in the formula (1) and $R^4$ in the formula (2), monovalent linear, branched, or cyclic alkyl groups having 1 to 12 carbon atoms, monovalent aromatic hydrocarbon groups having 6 to 20 carbon atoms, monovalent oxygen-containing organic groups, and monovalent nitrogen-containing organic groups can be given.

As examples of the alkyl groups, a methyl group, an ethyl group, an n-propyl group, an i-propyl group, an n-butyl group, a 2-methylpropyl group, a 1-methylpropyl group, a t-butyl group, a cyclopentyl group, and a cyclohexyl group can be given. As examples of the monovalent aromatic hydrocarbon groups, a phenyl group, an o-tolyl group, an m-tolyl group, a p-tolyl group, a 2,4-xylyl group, a 2,6-xylyl group, a 3,5-xylyl group, a mesityl group, an o-cumenyl group, an m-cumenyl group, a p-cumenyl group, a benzyl group, a phenethyl group, a 1-naphthyl group, and a 2-naphthyl group can be given.

The following groups can be given as examples of the monovalent oxygen-containing organic groups: a carboxyl group; linear, branched, or cyclic hydroxyalkyl groups having 1 to 8 carbon atoms such as a hydroxymethyl group, a 1-hydroxyethyl group, a 2-hydroxyethyl group, a 1-hydroxypropyl group, a 2-hydroxypropyl group, a 3-hydroxypropyl group, a 1-hydroxybutyl group, a 2-hydroxybutyl group, a 3-hydroxybutyl group, a 4-hydroxybutyl group, a 3-hydroxycyclopentyl group, and a 4-hydroxycyclohexyl group; linear, branched, or cyclic alkoxyl groups having 1 to 8 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group;
linear alkoxycarbonyloxy groups having 2 to 9 carbon atoms such as a methoxycarbonyloxy group, an ethoxycarbonyloxy group, an n-propoxycarbonyloxy group, and an n-butoxycarbonyloxy group; linear, branched, or cyclic (1-alkoxyalkoxy)alkyl groups having 3 to 11 carbon atoms such as a (1-methoxyethoxy)methyl group, a (1-ethoxyethoxy)methyl group, a (1-n-propoxyethoxy)methyl group, a (1-n-butoxyethoxy)methyl group, a (1-cyclopentyloxyethoxy)methyl group, a (1-cyclohexyloxyethoxy) methyl group, a (1-methoxypropoxy)methyl group, and a (1-ethoxypropoxy)methyl group; linear, branched, or cyclic alkoxycarbonyloxyalkyl groups having 3 to 10 carbon atoms such as a methoxycarbonyloxymethyl group, an ethoxycarbonyloxymethyl group, an n-propoxycarbonyloxymethyl group, an i-propoxycarbonyloxymethyl group, an n-butoxycarbonyloxymethyl group, a t-butoxycarbonyloxymethyl group, a cyclopentyloxycarbonyloxymethyl group, and a cyclohexyloxycarbonyloxymethyl group; and the like.

Examples of the monovalent nitrogen-containing organic groups include a cyano group; linear, branched, or cyclic cyanoalkyl groups having 2 to 9 carbon atoms such as a cyanomethyl group, a 1-cyanoethyl group, a 2-cyanoethyl group, a 1-cyanopropyl group, a 2-cyanopropyl group, a 3-cyanopropyl group, a 1-cyanobutyl group, a 2-cyanobutyl group, a 3-cyanobutyl group, a 4-cyanobutyl group, a 3-cyanocyclopentyl group, and a 4-cyanocyclohexyl group; and the like.

As examples of the monovalent acid-dissociable groups represented by $R^5$ in the formula (2), a substituted methyl group, a 1-substituted ethyl group, a 1-branched alkyl group, a triorganosilyl group, a triorganogermyl group, an alkoxycarbonyl group, an acyl group, and a monovalent cyclic acid-dissociable group can be given. As examples of the substituted methyl group, a methoxymethyl group, a methylthiomethyl group, an ethoxymethyl group, an ethylthiomethyl group, a methoxyethoxymethyl group, a benzyloxymethyl group, a benzylthiomethyl group, a phenacyl group, a bromophenacyl group, a methoxyphenacyl group, a methylthiophenacyl group, an α-methylphenacyl group, a cyclopropylmethyl group, a benzyl group, a diphenylmethyl group, a triphenylmethyl group, a bromobenzyl group, a nitrobenzyl group, a methoxybenzyl group, a methylthiobenzyl group, an ethoxybenzyl group, an ethylthiobenzyl group, a piperonyl group, a methoxycarbonylmethyl group, an ethoxycarbonylmethyl group, an n-propoxycarbonylmethyl group, an i-propoxycarbonylmethyl group, an n-butoxycarbonylmethyl group, and a t-butoxycarbonylmethyl group can be given.

As examples of the 1-substituted ethyl group, a 1-methoxyethyl group, a 1-methylthioethyl group, a 1,1-dimethoxyethyl group, a 1-ethoxyethyl group, a 1-ethylthioethyl group, a 1,1-diethoxyethyl group, a 1-ethoxypropyl group, a 1-propoxyethyl group, a 1-cyclohexyloxyethyl group, a 1-phenoxyethyl group, a 1-phenylthioethyl group, a 1,1-diphenoxyethyl group, a 1-benzyloxyethyl group, a 1-benzylthioethyl group, a 1-cyclopropylethyl group, a 1-phenylethyl group, a 1,1-diphenylethyl group, a 1-methoxycarbonylethyl group, a 1-ethoxycarbonylethyl group, a 1-n-propoxycarbonylethyl group, a 1-isopropoxycarbonylethyl group, a 1-n-butoxycarbonylethyl group, and a 1-t-butoxycarbonylethyl group can be given. As examples of the 1-branched alkyl group, an i-propyl group, a sec-butyl group, a t-butyl group, a 1,1-dimethylpropyl group, a 1-methylbutyl group, and a 1,1-dimethylbutyl group can be given.

As examples of the triorganosilyl group, a trimethylsilyl group, an ethyldimethylsilyl group, a methyldiethylsilyl group, a triethylsilyl group, an i-propyldimethylsilyl group, a methyldi-i-propylsilyl group, a tri-i-propylsilyl group, a t-butyldimethylsilyl group, a methyldi-t-butylsilyl group, a tri-t-butylsilyl group, a phenyldimethylsilyl group, a methyldiphenylsilyl group, and a triphenylsilyl group can be given. As examples of the triorganogermyl group, a trimethylgermyl group, an ethyldimethylgermyl group, a methyldiethylgermyl group, a triethylgermyl group, an isopropyldimethylgermyl group, a methyldi-i-propylgermyl group, a tri-i-propylgermyl group, a t-butyldimethylgermyl group, a methyldi-t-butylgermyl group, a tri-t-butylgermyl group, a phenyldimethylgermyl group, a methyldiphenylgermyl group, and a triphenylgermyl group can be given.

As examples of the alkoxycarbonyl group, a methoxycarbonyl group, an ethoxycarbonyl group, an i-propoxycarbonyl group, and a t-butoxycarbonyl group can be given. As examples of the acyl group, an acetyl group, a propionyl group, a butyryl group, a heptanoyl group, a hexanoyl group, a valeryl group, a pivaloyl group, an isovaleryl group, a lauroyl group, a myristoyl group, a palmitoyl group, a stearoyl group, an oxalyl group, a malonyl group, a succinyl group, a glutaryl group, an adipoyl group, a piperoyl group, a suberoyl group, an azelaoyl group, a sebacoyl group, an acryloyl group, a propioloyl group, a methacryloyl group, a crotonoyl group, an oleoyl group, a maleoyl group, a fumaroyl group, a mesaconoyl group, a campholoyl group, a benzoyl group, a phthaloyl group, an isophthaloyl group, a terephthaloyl group, a naphthoyl group, a toluoyl group, a hydroatropoyl group, an atropoyl group, a cinnamoyl group, a furoyl group, a thenoyl group, a nicotinoyl group, an isonicotinoyl group, a p-toluenesulfonyl group, and a mesyl group can be given.

As examples of the monovalent cyclic acid-dissociable group, a cyclopropyl group, a cyclopentyl group, a cyclohexyl group, a cyclohexenyl group, a 4-methoxycyclohexyl group, a tetrahydrofuranyl group, a tetrahydropyranyl group, a tetrahydrothiofuranyl group, a tetrahydrothiopyranyl group, a 3-bromotetrahydropyranyl group, a 4-methoxytetrahydropyranyl group, a 4-methoxytetrahydrothiopyranyl group, and a 3-tetrahydrothiophene-1,1-dioxide group can be given.

Of these monovalent acid-dissociable groups, a t-butyl group, a benzyl group, a 1-methoxyethyl group, a 1-ethoxyethyl group, a trimethylsilyl group, a t-butoxycarbonyl group, a t-butoxycarbonylmethyl group, a tetrahydrofuranyl group, a tetrahydropyranyl group, a tetrahydrothiofuranyl group, a tetrahydrothiopyranyl group, and the like are preferable.

As examples of the divalent acid-dissociable group represented by $R^9$ in the formula (4), a 2,3-dimethyl-2,3-butanediyl group, a 2,3-diethyl-2,3-butanediyl group, a 2,3-di-n-propyl-2,3-butanediyl group, a 2,3-diphenyl-2,3-butanediyl group, a 2,4-dimethyl-2,4-pentanediyl group, a 2,4-diethyl-2,4-pentanediyl group, a 2,4-di-n-propyl-2,4-pentanediyl group, a 2,4-diphenyl-2,4-pentanediyl group, a 2,5-dimethyl-2,5-hexanediyl group, a 2,5-diethyl-2,5-hexanediyl group, a 2,5-di-n-propyl-2,5-hexanediyl group, a 2,5-diphenyl-2,5-hexanediyl group, a 2,6-dimethyl-2,6-heptanediyl group, a 2,6-diethyl-2,6-heptanediyl group, a 2,6-di-n-propyl-2,6-heptanediyl group, a 2,6-diphenyl-2,6-heptanediyl group, a 2,4-dimethyl-3-(2-hydroxypropyl)-2,4-pentanediyl group, a 2,4-diethyl-3-(2-hydroxypropyl)-2,4-pentanediyl group, a 2,5-dimethyl-3-(2-hydroxypropyl)-2,5-hexanediyl group, a 2,5-diethyl-3-(2-hydroxypropyl)-2,5-hexanediyl group, a 2,4-dimethyl-3,3-di(2-hydroxypropyl)-2,4-pentanediyl group, a 2,4-diethyl-3,3-di(2-hydroxypropyl)-2,4-pentanediyl group, a 2,5-dimethyl-3,4-di(2-hydroxypropyl)-2,5-hexanediyl group, a 2,5-diethyl-3,4-di(2-hydroxypropyl)-2,4-hexanediyl group, and a 2,7-dimethyl-2,7-octanediyl group can be given.

As examples of preferable recurring units (1) in the present invention, units obtainable by cleavage of a polymerizable unsaturated bond such as 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, and 2,4,6-trihydroxystyrene can be given. The recurring units (1) may be used in the resin (B1) either alone or in combination of two or more.

As examples of preferable recurring units (2) in the present invention, units obtainable by cleavage of a polymerizable unsaturated bond such as 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, and 4-(1-ethoxyethoxy)-α-methylstyrene can be given. The recurring units (2) may be used in the resin (B1) either alone or in combination of two or more.

As preferable examples of the recurring unit (3), any of t-butyl(meth)acrylate, 1-methylcyclopentyl(meth)acrylate, and 1-ethylcyclopentyl(meth)acrylate can be given. The recurring units (3) may be used in the resin (B1) either alone or in combination of two or more.

The resin (B1) may include recurring units other than the recurring units (1) to (4) (hereinafter referred to as "other recurring units"). The other recurring units include units obtainable by cleavage of a polymerizable unsaturated bond of monomers such as, for example, vinyl aromatic compounds such as styrene, α-methylstyrene, 2-methylstyrene, 3-methylstyrene, 4-methylstyrene, 2-methoxystyrene, 3-methoxystyrene, 4-methoxystyrene, and 4-(2-t-butoxycarbonylethyloxy)styrene; (meth)acrylic esters such as methyl (meth)acrylate, ethyl(meth)acrylate, n-propyl(meth)acrylate, i-propyl(meth)acrylate, n-butyl(meth)acrylate, 2-methylpropyl(meth)acrylate, 1-methylpropyl(meth)acrylate, n-pentyl (meth)acrylate, neopentyl(meth)acrylate, n-hexyl(meth)acrylate, 2-ethylhexyl(meth)acrylate, 2-hydroxyethyl(meth)acrylate, 2-hydroxy-n-propyl(meth)acrylate, 3-hydroxy-n-propyl(meth)acrylate, phenyl(meth)acrylate, benzyl(meth)acrylate, 1-methyladamantyl(meth)acrylate, 1-ethyladamantyl(meth)acrylate, 8-methyl-8-tricyclodecyl (meth)acrylate, 8-ethyl-8-tricyclodecyl(meth)acrylate, 3-methyl-3-tetracyclododecenyl(meth)acrylate, 3-ethyl-3-tetracyclododecenyl(meth)acrylate, and 2,5-dimethylhexane-2,5-di(meth)acrylate; unsaturated carboxylic acids such as (meth)acrylic acid, crotonic acid, maleic acid, fumaric acid, and cinnamic acid, as well as anhydrides of these acids; carboxylalkyl esters of unsaturated carboxylic acids such as 2-carboxyethyl(meth)acrylate, 2-carboxy-n-propyl(meth)acrylate, and 3-carboxy-n-propyl(meth)acrylate; unsaturated nitryl compounds such as (meth)acrylonitrile, α-chloroacrylonitrile, crotonitrile, maleinnitrile, and fumaronitrile; unsaturated amide compounds such as (meth)acrylamide, N,N-dimethyl(meth)acrylamide, crotonamide, maleinamide, and fumaramide; unsaturated imide compounds such as maleimide, N-phenylmaleimide, and N-cyclohexylmaleimide; and other nitrogen-containing vinyl compounds such as N-vinyl-ε-caprolactam, N-vinylpyrrolidone, 2-vinylpyridine, 3-vinylpyridine, 4-vinylpyridine, 2-vinylimidazole, and 4-vinylimidazole. In the resin (B1), these other recurring units may be present either alone or in combination of two or more.

As examples of particularly preferable resin (B1) in the present invention, a 4-hydroxystyrene/4-t-butoxystyrene copolymer, a 4-hydroxystyrene/4-t-butoxystyrene/1-methylcyclopentyl acrylate copolymer, a 4-hydroxystyrene/4-t-butoxystyrene/1-ethylcyclopentyl acrylate copolymer, a 4-hydroxystyrene/4-t-butoxystyrene/styrene copolymer, a 4-hydroxystyrene/t-butyl acrylate/styrene copolymer, a 4-hydroxystyrene/1-methylcyclopentyl acrylate/styrene copolymer, a 4-hydroxystyrene/1-ethylcyclopentyl acrylate/styrene copolymer, and a 4-hydroxystyrene/4-t-butoxystyrene/2,5-dimethylhexane-2,5-diacrylate copolymer can be given.

The amount of the acid-dissociable groups introduced into the acid-dissociable group-containing resin (B) (the ratio of the acid-dissociable groups per the total number of non-protected acid functional groups and acid-dissociable groups in the acid-dissociable group-containing resin (B)) is preferably 10 to 90%, and still more preferably 15 to 90%, although the amount cannot be determined indescrimately regardless of on the types of acid-dissociable groups and the alkali-soluble resin into which the acid-dissociable groups are introduced.

In the resin (B1), the amount of the recurring unit (1) is preferably 60 to 80 mol %, and more preferably 65 to 75 mol %, the amount of the recurring unit (2) is preferably 15 to 40 mol %, and more preferably 20 to 35 mol %, and the amount of the recurring unit (3) is preferably 10 to 40 mol %, and more preferably 10 to 30 mol %, the amount of the recurring unit (4) is preferably 1 to 15 mol %, and more preferably 1 to 5 mol %, and the amount of the other recurring unit is usually 25 mol % or less, and preferably 10 mol % or less. If the amount of the recurring unit (1) is less than 60 mol %, adhesion of resist patterns to substrates tends to decrease; if more than 80 mol %, contrast after development tends to decrease. If the amount of the recurring unit (2) is less than 15 mol %, resolution tends to decrease; if it is more than 40 mol %, adhesion of resist patterns to substrates tends to decrease. If the amount of the recurring unit (3) is less than 10 mol %, resolution tends to decrease; if it is more than 40 mol %, dry etching resistance may be insufficient. If the amount of the recurring unit (4) is less than 1 mol %, resolution tends to decrease; if more than 15 mol %, resist sensitivity drastically decreases. If the amount of the other recurring unit is more than 25 mol %, the resist tends to exhibit poor resolution.

The polystyrene-reduced weight average molecular weight (hereinafter referred to as "Mw") of the acid-dissociable group-containing resin (B) determined by gel permeation chromatography (GPC) is preferably 1,000 to 150,000, and more preferably 3,000 to 100,000. The ratio of Mw to the polystyrene-reduced number average molecular weight (hereinafter referred to as "Mn") determined by GPC (Mw/Mn) of the acid-dissociable group-containing resin (B) is usually 1 to 10, and preferably 1 to 5.

The acid-dissociable group-containing resin (B) can be manufactured by polymerizing a polymerizable unsaturated monomer corresponding to the recurring unit (1), optionally together with a polymerizable unsaturated monomer corresponding to the recurring unit (3) and a polymerizable unsaturated monomer providing another recurring unit, and introducing one or more monovalent acid-dissociable groups ($R^5$) into the phenolic hydroxyl group of the polymer, or by copolymerizing a polymerizable unsaturated monomer corresponding to the recurring unit (1) and a polymerizable unsaturated monomer corresponding to the recurring unit (2), optionally together with a polymerizable unsaturated monomer corresponding to the recurring unit (3) and a polymerizable unsaturated monomer providing another recurring unit. In the present invention, the acid-dissociable group-containing resin (B) may be used either alone or in combination of two or more.

[3-C] Solvent (Component C)

The radiation-sensitive resin composition can normally be obtained by homogeneously dissolving the photoacid generator, the acid-dissociable group-containing resin (B), and other components described later in a solvent to prepare a precursor composition and filtering the precursor composition. In this instance, the solvent is used in an amount to make the total solid content of the resulting solution of usually 0.1 to 50 mass %, and preferably 1 to 40 mass %. The solid component concentration in this range ensures a smooth filtering operation. Since the radiation-sensitive resin composition is normally used as a solution with the above concentration, if the precursor composition is adjusted to have a concentration actually used as the radiation-sensitive resin composition before filtration, the concentration adjustment thereafter is unnecessary. As a solvent, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; formates such as n-amyl formate and i-amyl formate; acetates such as ethyl acetate, n-propyl acetate, i-propyl acetate, n-butyl acetate, i-butyl acetate, n-amyl acetate, i-amyl acetate, 3-methoxybutyl acetate, and 3-methyl-3-methoxybutyl acetate; propionates such as i-propyl propionate, n-butyl propionate, i-butyl propionate, and 3-methyl-3-methoxybutyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methyl-3-methoxybutylacetate, methyl acetoacetate, ethyl acetoacetate, methyl pyruvate, and ethyl pyruvate; aromatic hydrocarbons such as toluene and xylene;

ketones such as methyl ethyl ketone, 2-pentanone, 2-hexanone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone can be given. These solvents may be used either alone or in combination of two or more.

[3-D] Acid Diffusion Controller (Component D)

The acid diffusion controller controls diffusion of an acid in the resist film generated from the radiation-sensitive acid generator upon exposure to hinder undesired chemical reactions in the unexposed area. The addition of the acid diffusion controller improves storage stability of the composition and resolution as a resist. Moreover, the addition of the acid diffusion controller prevents the line width of the resist pattern from changing due to deviation in post-exposure delay (PED) from exposure to post-exposure heat treatment, whereby a composition with remarkably superior process stability can be obtained.

As the acid diffusion controller, nitrogen-containing organic compounds of which the basicity does not change due to exposure or a heat treatment during formation of a resist pattern are preferable. As examples of such nitrogen-containing organic compounds, a compound shown by the following formula (7), a compound shown by the following formula (8), a diamino compound having two nitrogen atoms in the molecule, a diamino polymer having three or more nitrogen atoms, an amide group-containing compound, a urea compound, and a heterocyclic compound containing a nitrogen atom can be given:

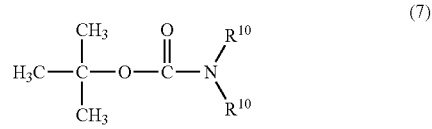

(7)

wherein each $R^{10}$ independently represents a monovalent organic group or the two $R^{10}$s bond together with the nitrogen atom in the formula to form a ring.

(8)

wherein each $R^{11}$ independently represents a hydrogen atom, a linear or branched alkyl group having 1 to 10 carbon atoms, a cycloalkyl group having 3 to 10 carbon atoms, an aryl group having 6 to 20 carbon atoms, or an aralkyl group having 7 to 18 carbon atoms, and the alkyl group, aryl group, or aralkyl group may be substituted with a functional group such as a hydroxyl group.

As examples of the monovalent organic group represented by $R^{10}$ in the formula (7), a linear or branched alkyl group having 1 to 10 carbon atoms, a cycloalkyl group having 3 to 10 carbon atoms, an aryl group having 6 to 20 carbon atoms, or an aralkyl group having 7 to 18 carbon atoms can be given. The alkyl group, aryl group, or aralkyl group may be substituted with a functional group such as a hydroxyl group. As an example of the ring formed by the $R^{10}$s and the nitrogen atom, a 5-member or 6-member ring can be given. Such a ring may further contain one or more additional hetero atoms such as nitrogen atoms, oxygen atoms, and the like.

Although there is no particular limitation to the amount of an acid diffusion controller to be incorporated, an amount not less than a predetermined amount is preferable in order to obtain the above affects. On the other hand, if the amount of the acid diffusion controller is too large, resist sensitivity and developability of the exposed area tend to decrease. Therefore, the amount of the acid diffusion controller to be added is usually 15 parts by mass or less, preferably 0.001 to 10 parts by mass, and still more preferably 0.005 to 5 parts by mass with respect to 100 parts by mass of the acid-dissociable group-containing resin (B).

[3-E] Other Additives

Various other additives such as surfactants and sensitizers can optionally be added to the radiation-sensitive resin composition of the present invention. The surfactant improves applicability, striation, developability as a resist, and the like. Examples of such surfactants are polyoxyethylene lauryl ether, polyoxyethylene stearyl ether, polyoxyethylene oleyl ether, polyoxyethylene-n-octylphenol ether, polyoxyethylene-n-nonyl phenol ether, polyethylene glycol dilaurate, polyethylene glycol distearate, and the like. As commercially available products, FTOP EF301, EF303, and EF352 (manufactured by Tohkem Products Corporation); MEGAFAC F171 and F173 (manufactured by Dainippon Ink and Chemicals, Inc.); Fluorad FC430 and FC431 (manufactured by Sumitomo 3M Ltd.); Asahi Guard AG710, Surflon S-382, SC-101, SC-102, SC-103, SC-104, SC-105, and SC-106 (manufactured by Asahi Glass Co., Ltd.); KP341 (manufactured by Shin-Etsu Chemical Co., Ltd.); and Polyflow No. 75 and No. 95 (manufactured by Kyoeisha Chemical Co., Ltd.) can be given. The amount of surfactant to be added is preferably 2 parts by mass or less for 100 parts by mass of the acid-dissociable group-containing resin (B).

As the sensitizer, benzophenones, rose bengals, anthracenes, and the like can be given. The amount of the sensitizer to be added is preferably 50 parts by mass or less with respect to 100 parts by mass of the acid-dissociable group-containing resin (B). In addition, a dye and/or a pigment may be added to visualize latent images of exposed areas to reduce the effect of halation during exposure. An adhesion adjuvant may be added to improve adhesion to the substrate.

As other additives, halation inhibitors such as 4-hydroxy-4'-methylchalcone, form improvers, preservation stabilizers, antifoaming agents, and the like can be added.

[4] Formation of Resist Pattern

A resist pattern is formed from the radiation-sensitive resin composition normally by applying a solution of the radiation-sensitive resin composition to substrates such as a silicon wafer or a wafer covered with aluminum using an appropriate application method such as rotational coating, cast coating, and roll coating to form a resist film. The resist film is then optionally prebaked (hereinafter referred to as "PB") at a temperature of about 70 to 160° C. and exposed to light through a predetermined mask pattern.

Radiation used can appropriately be selected according to the type of the photoacid generator from deep ultraviolet rays such as a KrF excimer laser (wavelength: 248 nm), an ArF excimer laser (wavelength: 193 nm), or an $F_2$ excimer laser (wavelength: 157 nm), X-rays such as synchrotron radiation, and charged particle rays such as electron beams. Deep ultraviolet rays such as a KrF excimer laser (wavelength: 248 nm) or the like are preferable. The exposure conditions such as the light exposure are appropriately determined depending on the composition of the radiation-sensitive resin composition, types of additives, and the like.

In the present invention, it is preferable to perform post-exposure bake (hereinafter referred to as "PEB") at 70 to 160° C. for 30 seconds or more to consistently form minute resist patterns with high precision. If the heating temperature for PEB is less than 70° C., sensitivity may fluctuate according to the type of the substrates.

A predetermined resist pattern is obtained by developing the resist using an alkaline developer generally at 10 to 50° C. for 10 to 200 seconds, preferably at 15 to 30° C. for 15 to 100 seconds, and still more preferably at 20 to 25° C. for 15 to 90 seconds. As the alkaline developer, an alkaline aqueous solution in which an alkaline compound such as tetraalkylammonium hydroxide is dissolved at a concentration of normally 1 to 10% by mass, preferably 1 to 5% by mass, and particularly preferably 1 to 3% by mass is used. Moreover, an appropriate amount of a water-soluble organic solvent such as methanol and ethanol or a surfactant can be added to the developer of the above alkaline aqueous solution. When forming a resist pattern, a protective film may be provided on the resist film in order to prevent an adverse effect of basic impurities and the like which are present in the environmental atmosphere.

EXAMPLES

The present invention will be described in more detail by way of examples. However, these examples should not be construed as limiting the present invention. The polystyrene-reduced Mw and Mn in the following Synthesis Examples were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene

[1] Acid-dissociable Group-containing Resin (Component B)

Synthesis Example 1

Synthesis of Acid-dissociable Group-containing Resin (B-1)

A separable flask was charged with 100 g of p-acetoxystyrene, 4.6 g of styrene, 38.8 g of p-t-butoxystyrene, 7.2 g of azobisisobutyronitrile, 2.0 g of t-dodecylmercaptan, and 145 g of propylene glycol monomethyl ether. The mixture was stirred at room temperature to prepare a homogeneous solution. The solution was heated to 80° C. and polymerized for 10 hours while stirring under a nitrogen atmosphere. After the polymerization, the reaction product was aggregated and purified using a large amount of methanol. 130 g of the resulting polymer was dissolved in 800 g of propylene glycol monomethyl ether, and the solution was concentrated under reduced pressure.

A separable flask was charged with about 300 g of the polymer solution, 60 g of triethylamine, 10 g of ion-exchanged water, and 300 g of methanol. A hydrolysis reaction was carried out while stirring and refluxing. The hydrolysis solution was concentrated under reduced pressure. The polymer was reprecipitated using a large amount of ion-exchanged water and dried under vacuum at 50° C. to obtain 100 g of p-hydroxystyrene/styrene/p-t-butoxy styrene (at a ratio of 70/5/25) copolymer (Mw: 10,000, Mw/Mn: 1.55). This copolymer is referred to as an "acid-dissociable group-containing resin (B-1)".

Synthesis Example 2

Synthesis of Acid-dissociable Group-containing Resin (B-2)

A separable flask was charged with 173 g of p-acetoxystyrene, 56 g of p-t-butoxystyrene, 11 g of 2,5-dimethylhexane-2,5-diacrylate, 14 g of azobisisobutyronitrile, 11 g of t-dodecylmercaptan, and 240 g of propylene glycol monomethyl ether. The mixture was stirred at room temperature to prepare a homogeneous solution. The mixture was maintained at 70° C. and polymerized for 16 hours in a nitrogen atmosphere. After the polymerization, the reaction product was added dropwise to 2,000 g of hexane to aggregate and purify a copolymer by reprecipitation. The resulting copolymer was dried at 50° C. for three hours under reduced pressure.

150 g of propylene glycol monomethyl ether was added to 190 g of the dried copolymer, followed by the addition of 300 g of methanol, 100 g of triethylamine, and 15 g of water. The mixture was hydrolyzed for eight hours while refluxing at the boiling point. After the hydrolysis reaction, the solvent and triethylamine were evaporated under reduced pressure to obtain a copolymer. The resulting copolymer was dissolved in acetone to make a solid-component concentration of 20%, and 2,000 g of water was added dropwise to coagulate the polymer. The obtained white precipitate was filtered and dried at 50° C. overnight under reduced pressure to obtain a copolymer of the final product. The copolymer thus obtained had an Mw of 27,000 and an Mw/Mn of 2.6. As a result of $^{13}$C-NMR analysis, the copolymerization ratio of p-acetoxystyrene (1), p-t-butoxystyrene (2), and 2,5-dimethylhexane-2,5-diacrylate (3) was confirmed to be (1):(2):(3)=75:22:3. This copolymer is referred to as an acid-dissociable group-containing resin (B-2).

The acid generators, acid diffusion controllers, and solvents used in Examples and Comparative Examples are as follows.

[2] Acid Generator (Component A)
(1) A-1: (p-fluorophenyl)(phenyl)iodonium 10-camphorsulfonate
(2) A-2: N-(trifluoromethanesulfonyloxy)bicyclo[2.2.1]hept-5-ene-2,3-dicarboxylmide
(3) A-3: 2,4,6-trimethylphenyldiphenylsulfonium 2,4-difluorobenzenesulfonate

[3] Solvent (Component C)
(1) C-1: ethyl lactate
(2) C-2: propylene glycol monomethyl ether acetate

[4] Acid Diffusion Controller (Component D)
(1) D-1: 2-phenylbenzimidazole

Examples 1 to 3 and Comparative Examples 1 to 9

Precursor compositions (Samples 1 to 3) were prepared by mixing the above-mentioned components at proportions described in the following Table 1, and filtered using "ABD1UG0037E" manufactured by Nihon Pall Ltd. (HDPE filter with a diameter of 0.03 μm) as a polyethylene resin filter and "ABD1UND8E" manufactured by Nihon Pall Ltd. (polyamide 66 filter with a diameter of 0.04 μm) as a polyamide resin filter under the following filtration conditions and according to patterns shown in Table 2 to obtain radiation-sensitive resin compositions (Examples 1 to 3 and Comparative Examples 1 to 9). A chemical pump ("DP-5F" manufactured by Yamada Co., Ltd.) was used under the filtration conditions of a precursor composition charge amount of 500 g, a filtration temperature of 23° C., and a linear velocity of 110 μm²/hr.

TABLE 1

| | | | Sample 1 | Sample 2 | Sample 3 |
|---|---|---|---|---|---|
| Component A | A-1 | parts by mass | 9 | — | — |
| | A-2 | parts by mass | 4 | 12 | 12 |
| | A-3 | parts by mass | — | 1 | — |
| Component B | B-1 | parts by mass | 100 | — | — |
| | B-2 | parts by mass | — | 100 | 100 |
| Component C | C-1 | parts by mass | 630 | 630 | 630 |
| | C-2 | parts by mass | 270 | 270 | 270 |
| Component D | D-1 | parts by mass | 0.5 | 0.5 | 0.5 |

The following substrate and devices were used in the Examples and Comparative Examples.

(1) Substrate: a substrate having an organic underlayer ("AR5" manufactured by Nissan Chemical Co., Ltd.) on a silicon wafer with a diameter of 200 mm (thickness: 600 angstroms, baking conditions: 190° C.×60 sec.)

(2) Coater developer apparatus: "CLEAN TRACK ACT8" defect measuring device manufactured by Tokyo Electron, Ltd.; Defect measuring device: "KLA2351" manufactured by KLA-Tencor Co.

(3) Exposure apparatus: KrF excimer laser scanner ("NSR S203B" manufactured by Nikon Corporation, optical conditions: NA=0.68, 2/3-Annu. σ=0.75)

The radiation-sensitive resin compositions (solutions) obtained in the Examples 1 to 3 and Comparative Examples 1 to 9 were spin-coated to a thickness of 0.23 μm (after PB) on the substrate, prebaked at 130° C. for 60 seconds, and exposed to light with the above exposure apparatus (Sample 1: 25 mJ/cm², Sample 2: 30 mJ/cm², and Sample 3: 32 mJ/cm²). The samples were submitted to post-exposure baking at 130° C. for 60 seconds and developed at 23° C. for 60 seconds by dipping in a 2.38 mass % tetramethylammonium hydroxide aqueous solution with the coater developer, washed with purified water, and dried to form a resist pattern (with repetition of 120 nm L/S). The number of bridge defects and other defects within the wafer side in the resulting wafer having the pattern were measured using the above defect measuring device. The results are shown in Table 2. A "bridge defect" herein refers to a defect having poor solubility in an alkaline developer and forming bridges between the lines in line-and-space patterns after development. The bridge defect causes an electric short circuit during a current flow test after an etching process. "Other defects" refers to a blob defect (caused by winding of a resin failed to deprotect some kind of insoluble material into nuclei) and pattern profile defects.

TABLE 2

| | Precursor composition | Filter | Number of filtration | Sensitivity (mJ/cm$^2$) | Number of bridge defects | Number of other defects |
|---|---|---|---|---|---|---|
| Example 1 | Sample 1 | X + Y (in series) | 100 | 20 | 19 | 4 |
| Example 2 | Sample 2 | | | 30 | 15 | 7 |
| Example 3 | Sample 3 | | | 32 | 13 | 2 |
| Comp. Ex. 1 | Sample 1 | X | 100 | 20 | 291 | 70 |
| Comp. Ex. 2 | | Y | 100 | 20 | 49 | 97 |
| Comp. Ex. 3 | | X + Y (in series) | 1 | 20 | 280 | 66 |
| Comp. Ex. 4 | Sample 2 | X | 100 | 30 | 276 | 66 |
| Comp. Ex. 5 | | Y | 100 | 30 | 44 | 100 |
| Comp. Ex. 6 | | X + Y (in series) | 1 | 30 | 246 | 59 |
| Comp. Ex. 7 | Sample 3 | X | 100 | 32 | 259 | 58 |
| Comp. Ex. 8 | | Y | 100 | 32 | 39 | 57 |
| Comp. Ex. 9 | | X + Y (in series) | 1 | 32 | 198 | 59 |

X: Polyethylene resin filter ("ABD1UG0037E" HDPE filter with a filter diameter of 0.03 µm, manufactured by Nihon Pall Ltd.)
Y: Polyamide resin filter ("ABD1UND8E" Polyamide66 filter with a filter diameter of 0.04 µm, manufactured by Nihon Pall Ltd.)

As is clear from Table 2, filtration of a precursor composition two or more times through a filter apparatus equipped with a filter composed of a polyethylene resin filter (X) and a polyamide resin filter (Y) connected in series, while circulating the precursor composition in the filter apparatus (i.e. circulation filtration), has been confirmed to drastically reduce bridge defects and the other defects.

On the other hand, as in Comparative Examples 1, 2, 4, 5, 7, and 8, when either the polyethylene resin filter (X) or the polyamide resin filter (Y) was used alone, neither the bridge defects nor the other defects could have been drastically reduced even if the circulation filtrations were conducted. As in Comparative Examples 3, 6, and 9, neither the bridge defects nor the other defects could have been drastically reduced when filtration was conducted only once even though a filter in which the polyethylene resin filter (X) and the polyamide resin filter (Y) were connected in series was used.

INDUSTRIAL APPLICABILITY

The radiation-sensitive resin composition produced by the process of the present invention can reduce development defects and can suitably be used as a resist for microfabrication utilizing various types of radiation such as deep ultraviolet rays such as a KrF excimer laser, an ArF excimer laser, or an F$_2$ excimer laser, X-rays such as synchrotron radiation, or charged particle rays such as electron beams.

The invention claimed is:
1. A process for producing a radiation-sensitive resin composition, comprising providing a filter apparatus equipped with a filter composed of a polyamide resin filter and a polyethylene resin filter connected in series, circulating a precursor composition for the radiation-sensitive resin composition, which comprises (A) a photoacid generator, (B) an alkali-insoluble or a scarcely alkali-soluble resin containing an acid-dissociable group, (C) a solvent, and (D) an acid diffusion controller, in the filter apparatus so that the precursor composition is passed through the filter two or more times to thereby effect filtration with the result that foreign matter is removed from the precursor composition.

2. The process for producing a radiation-sensitive resin composition according to claim 1, wherein the alkali-insoluble or scarcely alkali-soluble resin containing the acid-dissociable group (B) has (b-1) a recurring unit of the following formula (1) and (b-2) at least one recurring unit selected from the group consisting of the recurring unit having the following formula (2), the recurring unit having the following formula (3), and the recurring unit having the following formula (4),

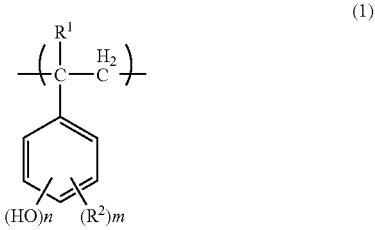

(1)

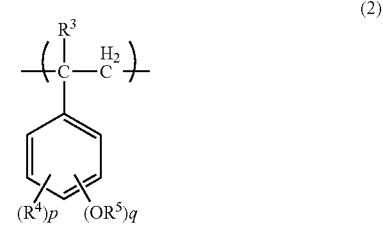

(2)

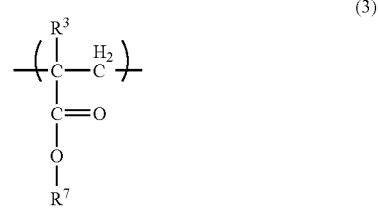

(3)

-continued

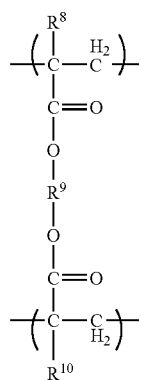

(4)

wherein, in the formula (1), $R^1$ represents a hydrogen atom or a methyl group, $R^2$ represents a monovalent organic group, excluding a group equivalent to —$OR^5$ in the formula (2), m is an integer from 0 to 3, n is an integer from 1 to 3, and two or more $R^2$ groups which may be present are either the same or different; in the formula (2), $R^3$ represents a hydrogen atom or a methyl group, $R^4$ represents a monovalent organic group, excluding a group equivalent to —$OR^5$, $R^5$ represents a monovalent acid-dissociable group, p is an integer from 0 to 3, q is an integer from 1 to 3, and two or more $R^4$ or $R^5$ groups which may respectively be present are either the same or different; in the formula (3), $R^6$ represents a hydrogen atom or a methyl group, and $R^7$ represents a t-butyl group, a 1-methylcyclopentyl group, or a 1-ethylcyclopentyl group; and in the formula (4), $R^8$ and $R^{10}$, which may be the same or different, represent hydrogen atoms or methyl groups, and $R^9$ represents a divalent acid-dissociable group.

* * * * *